United States Patent
Cai et al.

(10) Patent No.: US 9,305,916 B1
(45) Date of Patent: Apr. 5, 2016

(54) ESD POWER CLAMP FOR SILICON-ON-INSULATOR (SOI) AND FINFET PROCESSES LACKING PARASITIC ESD DIODE

(71) Applicant: Hong Kong Applied Science & Technology Research Institute Company limited, Hong Kong (HK)

(72) Inventors: Xiaowu Cai, Shenzhen (CN); Beiping Yan, Hong Kong (HK); Xiao Huo, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 0 days.

(21) Appl. No.: 14/585,459

(22) Filed: Dec. 30, 2014

(51) Int. Cl.
| | |
|---|---|
| *H01L 29/49* | (2006.01) |
| *H01L 27/02* | (2006.01) |
| *H01L 27/12* | (2006.01) |
| *H01L 29/06* | (2006.01) |
| *H01L 29/78* | (2006.01) |
| *H01L 49/02* | (2006.01) |
| *H01L 23/528* | (2006.01) |
| *H01L 29/861* | (2006.01) |

(52) U.S. Cl.
CPC ........ *H01L 27/0285* (2013.01); *H01L 23/5286* (2013.01); *H01L 27/0288* (2013.01); *H01L 27/1211* (2013.01); *H01L 28/20* (2013.01); *H01L 28/40* (2013.01); *H01L 29/0649* (2013.01); *H01L 29/785* (2013.01); *H01L 29/861* (2013.01)

(58) Field of Classification Search
CPC ............ H01L 27/0285; H01L 23/5286; H01L 27/0288; H01L 27/1211; H01L 28/20; H01L 28/40; H01L 29/0649; H01L 29/785; H01L 29/861

See application file for complete search history.

(56) References Cited

U.S. PATENT DOCUMENTS

| | | | |
|---|---|---|---|
| 5,239,440 A | 8/1993 | Merrill | |
| 6,762,622 B2 * | 7/2004 | Lin | ................. H03K 19/00315 326/27 |
| 7,518,845 B2 | 4/2009 | Gauthier, Jr. et al. | |
| 9,025,289 B1 * | 5/2015 | Peng | ....................... H02H 3/02 361/118 |
| 9,166,402 B2 * | 10/2015 | Schulmeyer | ........... H02H 9/046 |
| 2010/0142105 A1 | 6/2010 | Linten et al. | |

OTHER PUBLICATIONS

Steven Thijs et al., "Advanced ESD Power Clamp Design for SOI FinFET CMOS Technology", ICICDT 2010, Jun. 2010.

Junjun Li, et al., "A compact timed-shutoff, MOSFET-based power clamp for on-chip ESD protection", EOS/ESD, 2004.

* cited by examiner

*Primary Examiner* — Michael Shingleton

(74) *Attorney, Agent, or Firm* — Stuart T. Auvinen; gPatent LLC

(57) ABSTRACT

An Electro-Static-Discharge (ESD) protection circuit uses Silicon-On-Insulator (SOI) transistors with buried oxide but no parasitic substrate diode useable for ESD protection. A filter voltage is generated by a resistor and capacitor. When a VDD-to-VSS ESD positive pulse occurs, the filter voltage passes through an n-channel pass transistor and inverted to drive a gate of a big SOI transistor that shunts ESD current. A second path is used for a VSS-to-VDD ESD positive pulse. The filter voltage passes through a p-channel pass transistor to the gate when the positive ESD pulse is applied to VSS. The big SOI transistor can connect between VDD and VSS for a power clamp, and the gates of the n-channel and p-channel pass transistors connect to VDD. A small diode may be added between VDD and VSS to generate a small triggering current to activate grounded-gate transistors near I/O pads for full-chip Pad-based ESD protection.

20 Claims, 14 Drawing Sheets

SOI FIN-FET
PRIOR ART

NORMAL POWERED STATE

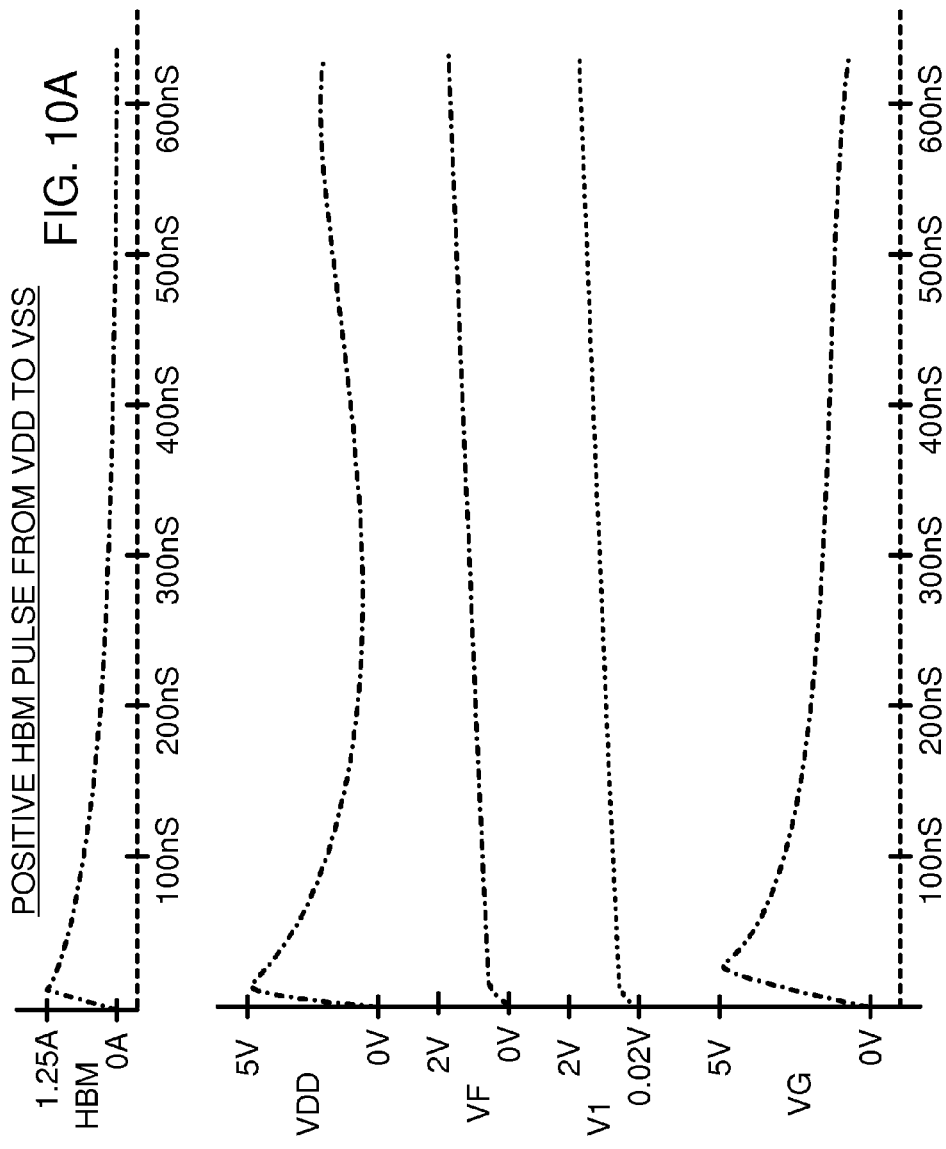

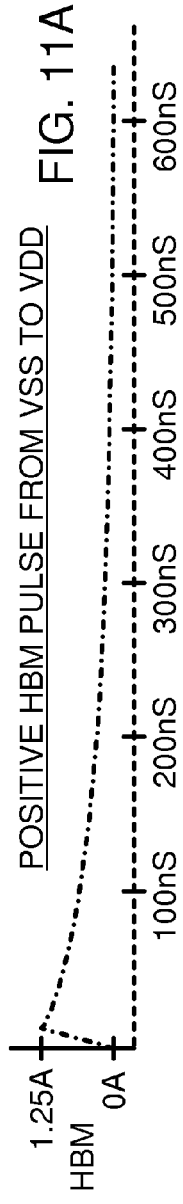
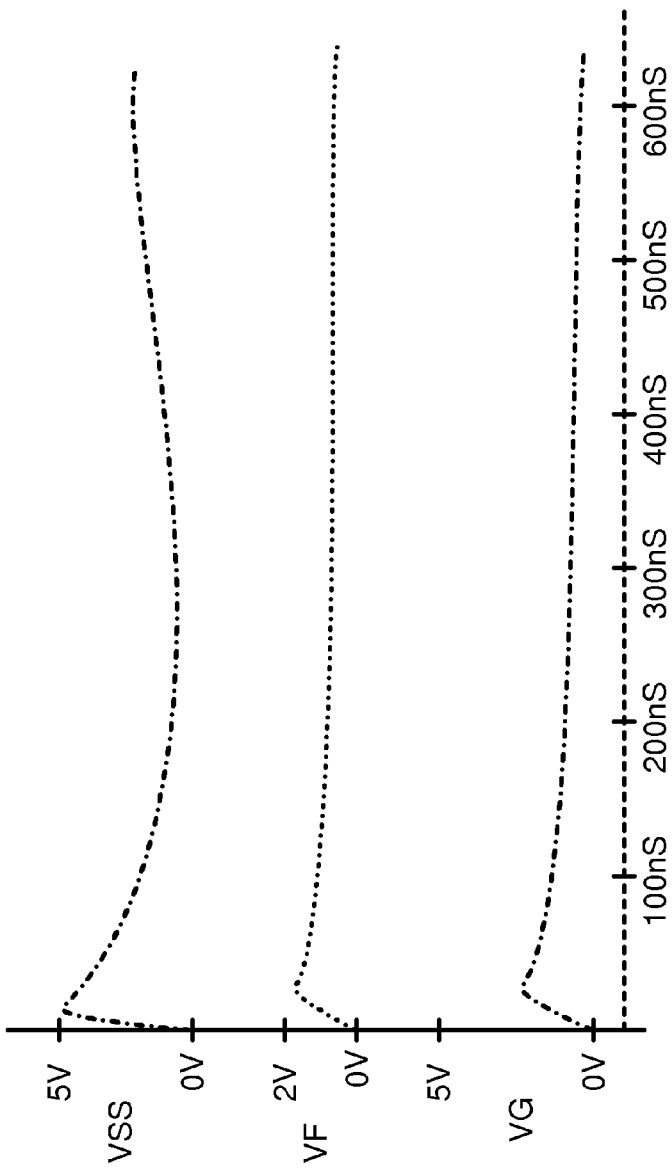
FIG. 11A
FIG. 11B

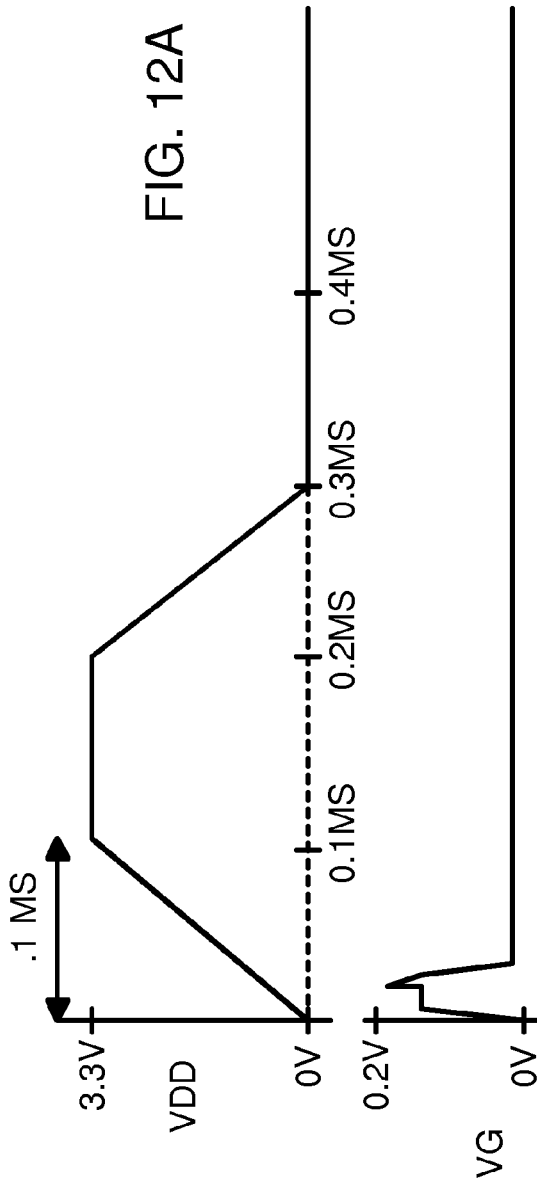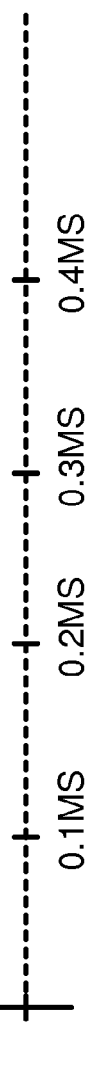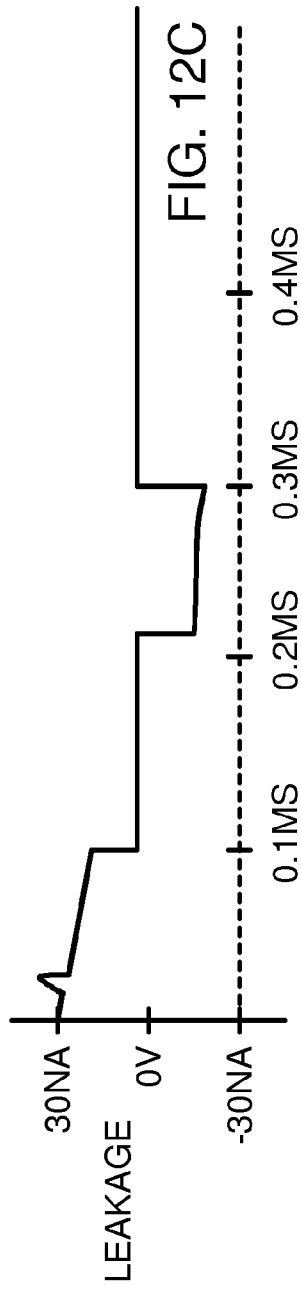

ESD POWER CLAMP FOR SILICON-ON-INSULATOR (SOI) AND FINFET PROCESSES LACKING PARASITIC ESD DIODE

FIELD OF THE INVENTION

This invention relates to Electro-Static-Discharge (ESD) protection circuits, and more particularly for using Silicon-On-Insulator (SOI) devices for protection clamps.

BACKGROUND OF THE INVENTION

Higher speed semiconductor devices may be achieved by reducing parasitic capacitances. A typical metal-oxide-semiconductor field-effect transistor (MOSFET) transistor is fabricated on a silicon substrate or within a well in the substrate, and has a large parasitic capacitance to this substrate or well.

Silicon-On-Insulator (SOI) processes eliminate the substrate or well, replacing it with an insulator layer such as a buried oxide. The transistor source, drain, and channel typically are formed on top of the buried oxide so that there is little or no parasitic capacitance to the substrate. Thus SOI devices may achieve much higher operating speeds than traditional silicon processes.

However, the extremely tiny transistors have a thin gate oxide that can be damaged by relatively small currents with even a moderate driving force (voltage). Special care is required when a human handles these semiconductor devices.

Static electricity that normally builds up on a person can discharge across any pair of pins of a semiconductor integrated circuit (IC or chip). IC chips are routinely tested for resistance to such electrostatic discharges (ESD) using automated testers that apply a Human-Body Model (HBM) current pulse across different pairs of pins of the chip. Any pair of pins may be chosen for the ESD test.

In a power clamp, large transistors with gate widths of 1,000 to 5,000 μm have been used for protection. Such large transistors are usually a Field-Effect Transistor (FET) and are referred to as a BigFET.

FIG. 1 shows a prior art power-to-ground ESD protection circuit with an active R-C triggered BigFET power clamp.

An R-C sensing element is formed by capacitor 22 and resistor 20. Inverters 10, 12, 14 invert the sensed voltage between capacitor 22 and resistor 20, and drive the gate of n-channel power clamp BigFET 18.

Under normal conditions, resistor 20 drives the input of inverter 10 high, causing a low to be driven onto the gate of n-channel BigFET 18, keeping it off. When the power-to-ground voltage suddenly spikes high, such as during a positive ESD event, capacitor 22 keeps the input of inverter 10 low for a period of time determined by the R-C time constant. The low input to inverter 10 drives the gate of n-channel BigFET 18 high, turning on n-channel BigFET 18 and shunting current from power to ground, dissipating the ESD pulse applied to the power line. After the R-C time period has elapsed, resistor 20 pulls the input to inverter 10 high, and a low is driven onto the gate of n-channel BigFET 18, turning it off.

Sometimes the polarity of the ESD pulse is reversed. A positive pulse may be applied to ground, while VDD is grounded. N-channel BigFET 18 might not turn on for such a negative pulse. However, when n-channel BigFET 18 is formed with a typical silicon process, parasitic substrate diode 19 also exists due to the source/drain-to-substrate p-n junctions under n-channel BigFET 18. Since n-channel BigFET 18 is a physically large device, parasitic substrate diode 19 is also a large device that can carry the large ESD currents.

The positive ESD pulse applied to ground is shunted through parasitic substrate diode 19 to VDD, rather than through n-channel BigFET 18.

FIG. 2 is a cross-section of a BigFET ESD protection device using a typical silicon process. P-well 50 is formed in n-substrate 56, and source/drain/tap regions are formed by openings in field oxide 54. N+ regions 42, 44, 48 and P+ region 46 are formed in P-well 50.

Parasitic substrate diode 19 is formed by P-well 50 and N+ region 42. Gate 52 with gate oxide 60 form n-channel BigFET 18 that conduct between N+ region 42 and N+ region 44 when a positive ESD pulse is applied to terminal A and terminal B is grounded. However, when the positive ESD pulse is applied to terminal B and terminal A is grounded, n-channel BigFET 18 may remain off. Instead, parasitic substrate diode 19 is forward biased and conducts the ESD pulse from terminal B, through P+ region 46 that taps P-Well 50, across the pn junction to N+ region 42, and out to grounded terminal A.

Although circuit designers may believe that n-channel BigFET 18 is providing protection, parasitic substrate diode 19 may actually be conducting for negative ESD pulses. Parasitic substrate diode 19 may be left out of circuit schematics, but it is still present when a typical silicon process is used.

ESD protection circuits that work for typical silicon processes may fail when migrated to Silicon-On-Insulator (SOI) processes. SOI processes lack parasitic substrate diode 19. Current can no longer be shunted through parasitic substrate diode 19 since it does not exist on a SOI process.

FIG. 3 is a cross-section of a BigFET ESD protection device on a SOI process. Buried oxide 62 is a layer formed on top of substrate 56. Substrate 56 could be a silicon substrate or could be a sapphire or other substrate. Buried oxide 62 isolates substrate 56 from N+ regions 42, 44 and channel region 64 formed under gate 52 and gate oxide 60 in n-channel BigFET 18 (FIG. 1). It is not possible for ESD current from terminal B to pass from N+ region 44 through substrate 56 to N+ region 42 and terminal A, since Buried oxide 62 blocks all current flow to substrate 56. Thus parasitic substrate diode 19 is not present.

In a standard SOI process, N+ regions 42, 44 are formed on top of buried oxide 62. Field oxide 54 isolates each SOI transistor from its neighbors. Channel region 64 is a silicon region that has an opposite doping from the source/drain regions, such as p-type for an NMOS transistor. In a floating body SOI process a thin conducting channel region forms under gate oxide 60 when gate 52 is at a high voltage. This conducting channel has an opposite polarity of electric carriers than does the channel region itself, so the conducting channel is known as an inversion layer. A non-conducting depletion region may form under the channel in channel region 64 while the remainder of channel region 64 is not depleted. In a SOI fully depleted device, all of channel region 64 is depleted, rather than just the top of channel region 64. Gate oxide 60 could be a thin gate oxide or could be a thicker oxide for n-channel BigFET 18.

FIG. 4 shows a SOI FIN-FET device. Another variation of SOI processes produces a FIN-FET device. N+ regions 42, 44 are still formed on top of buried oxide 62, but N+ regions 42, 44 are very thin, having a fin-like appearance. Between N+ region 42 and N+ region 44 is a connecting region of lightly-p-doped silicon that acts as the transistor channel. N+ region 42, the channel connecting region, and N+ region 44 can all be formed on the same fin of silicon.

Gate 52 is formed around the channel connecting region. Rather than being flat, gate 52 has an inverted U-shape that surrounds the channel connecting region between N+ regions

42, 44. As gate oxide 60 is formed on three sides of the fin-like channel connecting region rather than only on the top surface of the channel region.

FIN-FET transistors may have better current drive than equivalent flat transistors for the same die area due to this 3-D gate and channel structure. However, buried oxide 62 prevents formation of parasitic substrate diode 19. ESD protection devices cannot rely on parasitic substrate diode 19 when SOI or FIN-FET processes are used.

Some SOI ESD protection devices add a shunt diode across n-channel BigFET 18. However, this added shunt diode must carry a large current and thus has a large area and cost.

Other SOI ESD protection circuits may not provide full rail protection, where the ESD pulse may be applied to any pair of pins, and the internal VDD and ground rails in the chip are used to route the ESD current. However, the internal circuits might be easily damaged.

What is desired is an ESD-protection circuit that uses SOI transistors without a parasitic substrate diode. An ESD-protection circuit for SOI that provides full ESD protection for any ESD zapping combination of pins is desirable. An SOI ESD-protection circuit that does not have a large shunt diode is desirable. Rail-based and pad-based full-chip protection with a SOI ESD-protection circuit that does not have a large shunt diode is desired.

BRIEF DESCRIPTION OF THE DRAWINGS

FIG. 10A is a current waveform of a positive HBM 2000V ESD input pulse from VDD to VSS.

FIG. 10B shows voltage waveforms of nodes of the circuit of FIG. 5 when the positive HBM current pulse of FIG. 10A is applied to VDD and VSS is held at ground.

FIG. 11A is a current waveform of a positive HBM 2000V ESD input pulse from VSS to VDD.

FIG. 11B shows voltage waveforms of nodes of the circuit of FIG. 5 when the positive HBM current pulse of FIG. 11A is applied to VSS and VDD is held at ground.

FIGS. 12A-C simulates gate voltages that might cause leakage when VDD is powered on using a slow rise in VDD.

DETAILED DESCRIPTION

The present invention relates to an improvement in Electro-Static-Discharge (ESD) protection power clamps using Silicon-On-Insulator (SOI) devices. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 5:
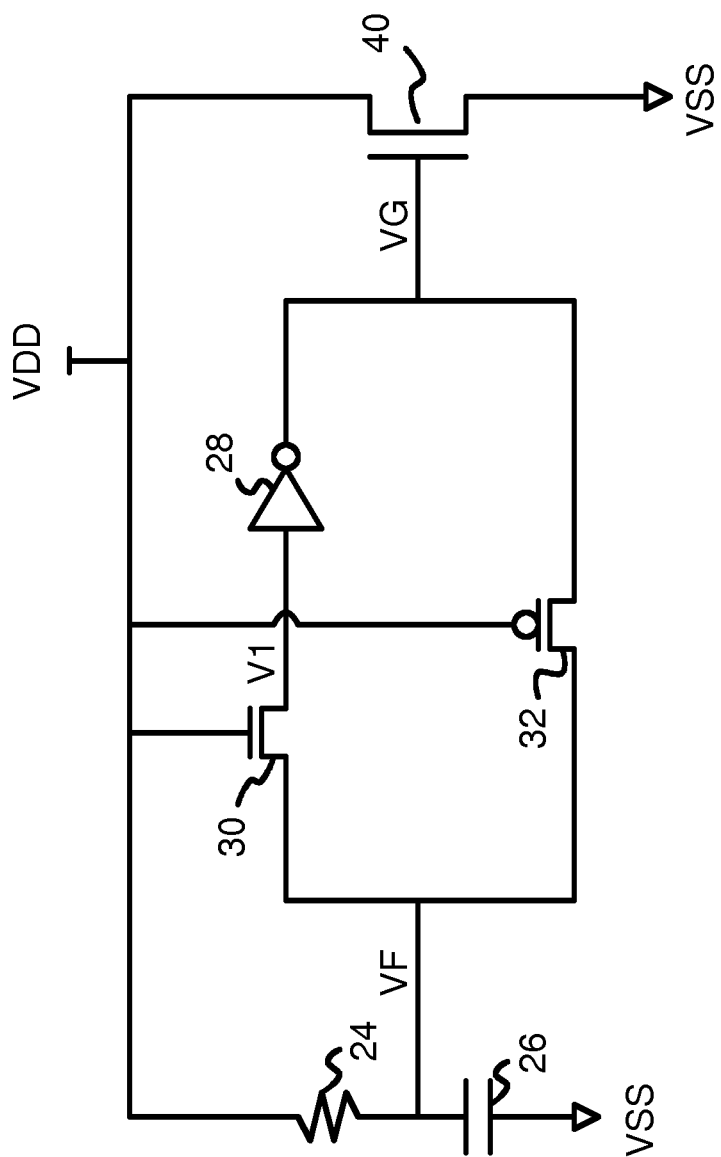
FIG. 5 is a schematic diagram of a bi-directional dual-path Silicon-On-Insulator (SOI) Electro-Static-Discharge (ESD) protection circuit.

FIG. 5 is a schematic diagram of a bi-directional dual-path Silicon-On-Insulator (SOI) Electro-Static-Discharge (ESD) protection circuit. Resistor 24 and capacitor 26 form an R-C filter between VDD and ground (VSS) and generate filter voltage VF. Big SOI transistor 40 is a large transistor connected between VDD and VSS that is controlled by gate VG. Big SOI transistor 40 is formed on an SOI process so that it does not have a parasitic substrate diode. Instead, big SOI transistor 40 may be symmetric and allow current to flow in either direction, so that negative ESD pulses are shunted as well as positive ESD pulses.

There are two paths from filter voltage VF to gate VG. One path is used to turn on big SOI transistor 40 for a positive ESD pulse from VDD to VSS, and the other path turns on Big SOI transistor 40 for a negative ESD pulse from VDD to VSS.

The positive ESD-pulse path has filter voltage VF passing through n-channel pass transistor 30 to node V1, which is inverted by inverter 28 to drive gate VG high to shunt the positive ESD pulse from VDD to VSS.

The negative ESD-pulse path has filter voltage VF passing through p-channel pass transistor 32 to drive gate VG high to shunt the negative ESD pulse from VDD to VSS. Positive current flows from VSS to VDD through big SOI transistor 40.

Pass transistors 30, 32 and the transistors in inverter 28 can all be SOI transistors. The gate oxide of big SOI transistor 40 can be larger than the minimum to provide better reliability.

Figure 6:
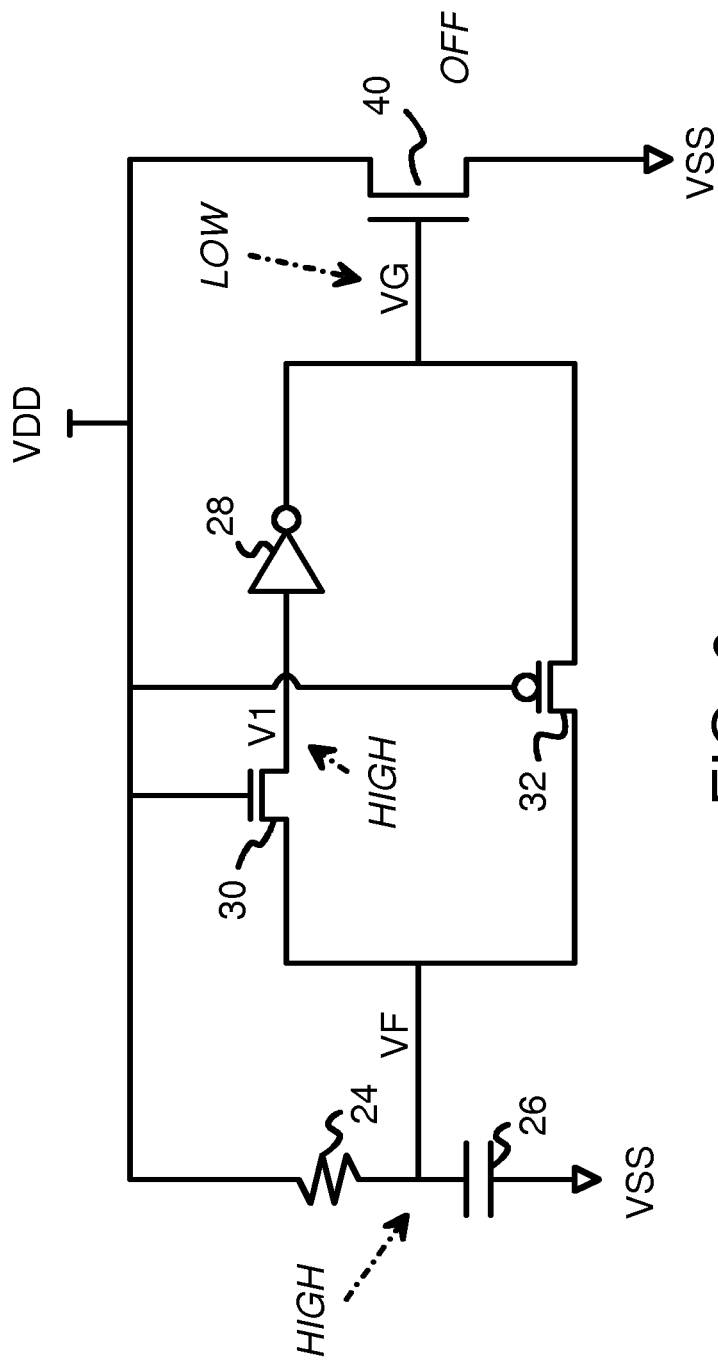
FIG. 6 shows the dual-path SOI ESD-protection circuit in the normal powered state.

FIG. 6 shows the dual-path SOI ESD-protection circuit in the normal powered state. When the integrated circuit (IC) having the SOI ESD-protection circuit is normally powered up, leakage through the ESD-protection circuit is very small. After the R-C time delay from power-up, resistor 24 charged the top plate of capacitor 26 high to VDD, so that filter voltage VF is high. The high VDD applied to the gate of p-channel pass transistor 32 turns it off. However, the high VDD applied to the gate of n-channel pass transistor 30 turns n-channel pass transistor 30 on, passing VF to node V1. The high VF and V1 is inverted by inverter 28 to drive gate VG low, turning off big SOI transistor 40. Thus big SOI transistor 40 does not conduct during normal operation.

Figure 7:
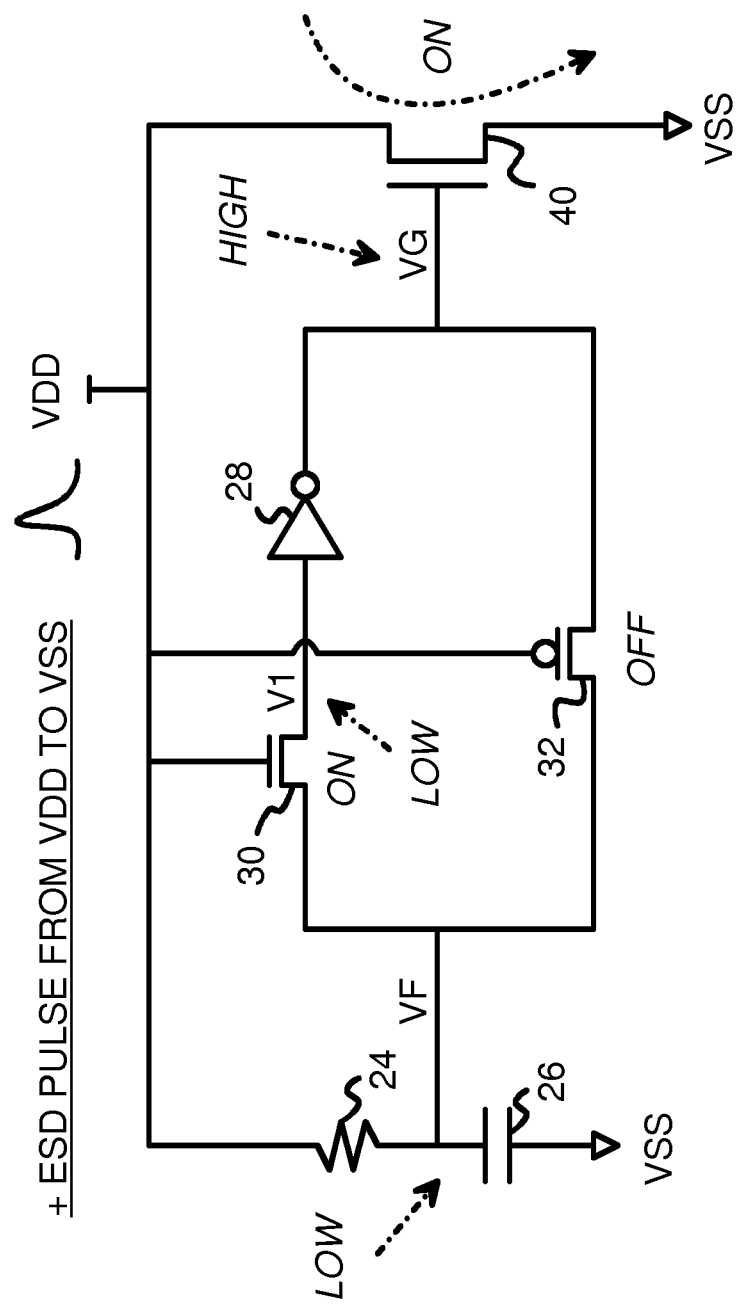
FIG. 7 shows the dual-path SOI ESD-protection circuit shunting a positive ESD pulse from VDD to VSS.

FIG. 7 shows the dual-path SOI ESD-protection circuit shunting a positive ESD pulse from VDD to VSS. When a positive ESD pulse is applied to VDD and VSS is held at ground, capacitor 26 initially holds filter voltage VF low, since resistor 24 slows charging of capacitor 26 due to the R-C time constant.

The high VDD receiving the ESD pulse raises the gate voltages of both n-channel pass transistor 30 and p-channel pass transistor 32. The high VDD turns off p-channel pass transistor 32 but turns on n-channel pass transistor 30.

The low VF is passed through n-channel pass transistor 30 to node V1, and the low V1 is inverted by inverter 28 to drive gate VG high. The high VG turns on big SOI transistor 40, which conducts the ESD current from VDD to VSS. The size of big SOI transistor 40 is large enough to shunt most of the ESD pulse to ground before the R-C time constant expires.

After the R-C time constant elapses, resistor 24 charges capacitor 26 high, raising VF so that inverter 28 drives CG low, turning off big SOI transistor 40.

Figure 8:
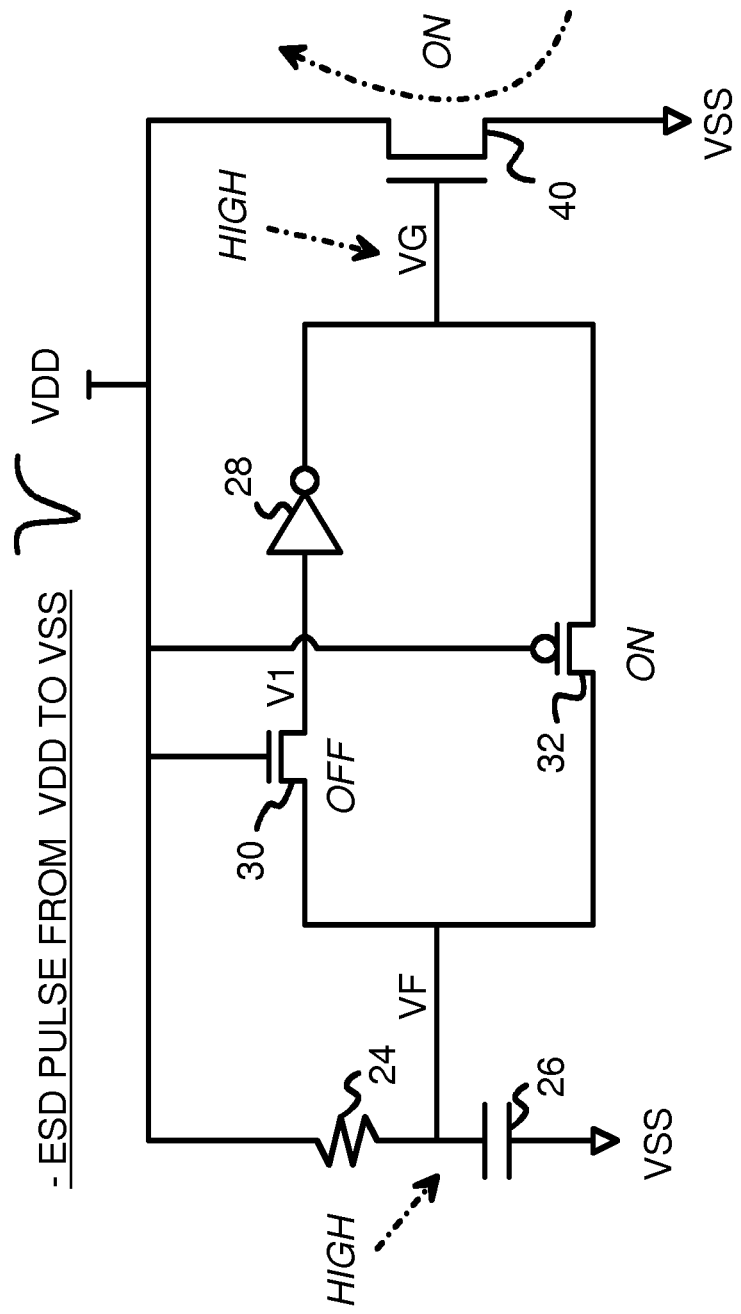
FIG. 8 shows the dual-path SOI ESD-protection circuit shunting a negative ESD pulse from VDD to VSS.

FIG. 8 shows the dual-path SOI ESD-protection circuit shunting a negative ESD pulse from VDD to VSS. When a negative ESD pulse is applied to VDD and VSS is held at ground, capacitor 26 initially holds filter voltage VF high near ground, since resistor 24 slows discharging of capacitor 26 due to the R-C time constant.

The low VDD receiving the negative ESD pulse lowers the gate voltages of both n-channel pass transistor 30 and p-channel pass transistor 32. The low VDD turns off n-channel pass transistor 30 but turns on p-channel pass transistor 32.

The relatively high VF pass through p-channel pass transistor 32 to gate VG. The high VG turns on big SOI transistor 40, which conducts positive ESD current from VSS to VDD.

Figure 9:
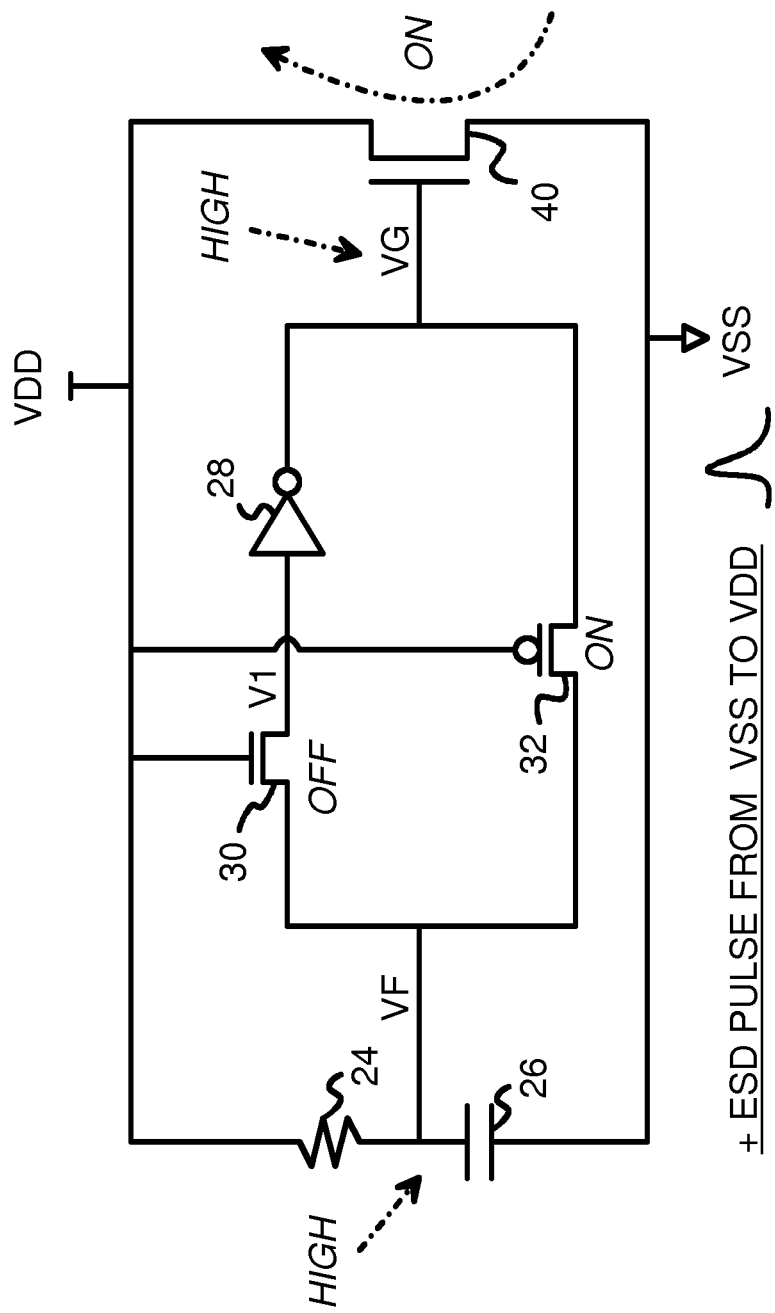
FIG. 9 shows the dual-path SOI ESD-protection circuit shunting a positive ESD pulse from VSS to VDD.

FIG. 9 shows the dual-path SOI ESD-protection circuit shunting a positive ESD pulse from VSS to VDD. A mechanism similar to that of FIG. 8 occurs when a positive ESD pulse is applied to VSS and VDD is held at ground. Capacitor 26 acts as a high-frequency short, causing VF to go high with the positive ESD pulse on VSS. The high VF passes through p-channel pass transistor 32 to drive VG high, turning on big SOI transistor 40. Positive ESD current flows from VSS to VDD until the ESD pulse is dissipated.

FIG. 10A is a current waveform of a positive HBM 2000V ESD input pulse from VDD to VSS. The current applied rises suddenly to 1.3 amps in only about 10 ns. The current then decreases over the next 600 ns.

FIG. 10B shows voltage waveforms of nodes of the circuit of FIG. 5 when the positive HBM current pulse of FIG. 10A is applied to VDD and VSS is held at ground. The filter voltage VF initially is held low by filter capacitor 26 during the ESD pulse. VF gradually rises for over 600 ns due to the R-C time constant of the filer.

The high VDD turns on n-channel pass transistor 30, causing VF to pass through to V1 and then be inverted to drive VG. VG rises with VDD as the ESD pulse raises VDD, but then both VDD and VG fall as big SOI transistor 40 turns on and shunts current away from VDD.

FIG. 11A is a current waveform of a positive HBM 2000V ESD input pulse from VSS to VDD. The current applied rises suddenly to 1.3 amps in only about 10 ns. The absolute current then decreases over the next 600 ns.

FIG. 11B shows voltage waveforms of nodes of the circuit of FIG. 5 when the positive HBM current pulse of FIG. 11A is applied to VSS and VDD is held at ground. This may be modeled as a negative ESD pulse applied to VDD while VSS is held at ground. The filter voltage VF initially jumps high from ground to about 2 volts due to filter capacitor 26 coupling the ESD pulse on VSS. Then VF gradually falls for over 600 ns due to the R-C time constant of the filer.

The low VDD turns on p-channel pass transistor 32, causing VF to pass through to VG. VG rises with VF as the ESD pulse raises VSS, but then both VSS and VG fall as big SOI transistor 40 turns on and shunts current from VSS to VDD.

FIGS. 12A-C simulates gate voltages that might cause leakage when VDD is powered on using a slow rise in VDD. The power supply VDD rises from ground to 2.5 volts in 0.1 millisecond (ms) in the simulation of FIG. 12A. The simulation keeps VDD at the normal power-supply voltage for another 0.1 ms before dropping VDD to ground over another 0.1 ms.

In FIG. 12B, as the power voltage is slowly raised, the gate voltage VG initially rises to about 0.2 mV. However 0.2 mV is below the transistor threshold voltage, so big SOI transistor 40 does not turn on. As VDD continues to rise, the gate voltage is driven to ground. The gate voltage VG remains at ground until the circuit is powered off. Thus big SOI transistor 40 remains off, preventing leakage during normal power up and power down.

FIG. 12C shows that the leakage of the circuit of FIG. 5 is initially around 30 nano-amps (na) during power-up, but then falls and is near zero when the circuit is fully powered up. A negative leakage of about −20 na occurs during power down.

Figure 13:
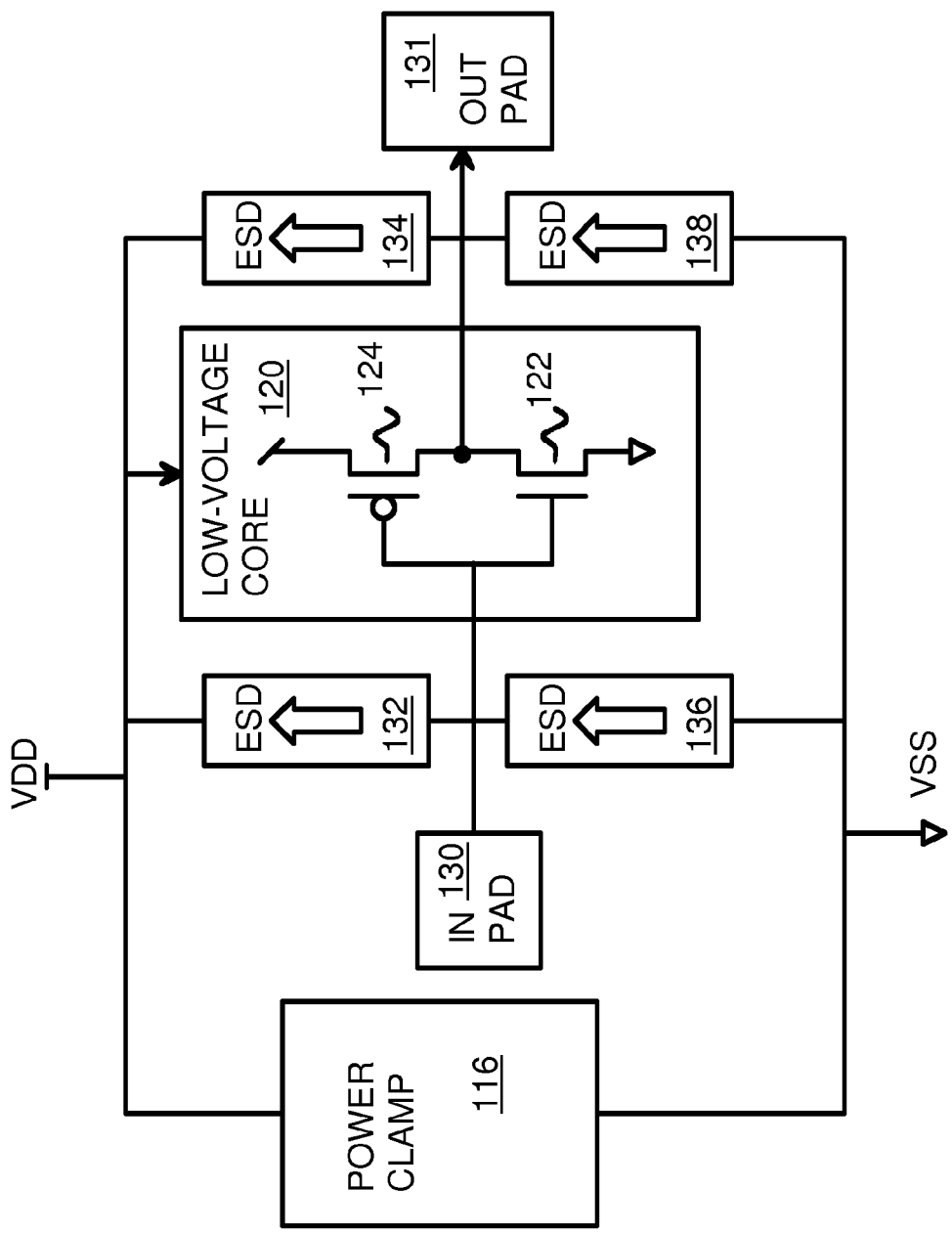
FIG. 13 shows a SOI chip with several ESD-protection structures.

FIG. 13 shows a SOI chip with several ESD-protection structures. Low-voltage core circuitry 120 contains core transistors 122, 124, which have a small channel length and can be damaged by relatively low voltages. Low-voltage core circuitry 120 receives a power supply voltage VDD, such as 5 volts, 3 volts, 1.8 volts, 1.2 volts, or some other value. There may be thousands of core transistors in low-voltage core circuitry 120.

Protection from ESD pulses may be provided on each I/O pad, and by power clamp 116. Power clamp 116 is coupled between VDD and ground (VSS), and shunts current from an ESD pulse between the power rails. Power clamp 116 may be the dual-path SOI ESD-protection circuit of FIG. 5. ESD-protection devices 132, 134, 136, 138 may be the dual-path SOI ESD-protection circuit of FIG. 5, or may be a simpler circuit such as a big SOI transistor or a big diode.

Some cross-coupling may occur between different pads and low-voltage core circuitry 120, such as through substrates and capacitances, but this coupling is reduced when SOI technology is used. An ESD pulse applied to one I/O pad 130 may be coupled into low-voltage core circuitry 120, causing damage to transistors 122, 124 in low-voltage core circuitry 120. Power clamp 116 may shunt enough current from the ESD pulse to reduce such cross-coupling to prevent damage. ESD pulses applied to I/O pins may still couple into low-voltage core circuitry 120, such as through power lines, but power clamp 116 may then be activated to reduce potential damage.

Power clamp 116 may also turn on for other ESD pulses such as those applied to I/O pins, when the ESD pulse is shunted through a diode in the I/O pin's ESD-protection structure to the internal VDD rail, causing an indirect VDD-to-VSS ESD pulse. For example, an ESD pulse applied between I/O pad 130 and VDD may cause ESD protection device 132 to turn on to conduct to VDD.

Each I/O pad 130 may be outfitted with several ESD protection devices 132, 134, 136, 138 to protect against various possibilities. ESD protection device 132 and power clamp 116 turn on for a positive ESD pulse applied between I/O pad 130 and ground, while ESD protection device 136 turns on for a negative ESD pulse applied between I/O pad 130 and ground. Likewise, ESD protection device 132 turns on for a positive ESD pulse applied between I/O pad 130 and VDD, while ESD protection device 136 and power clamp 116 turn on for a negative ESD pulse applied between I/O pad 130 and VDD. Power clamp 116 may also turn on in some situations.

Rail-based protection is provided between any 2 pins. For example, an ESD pulse applied to I/O pad 130 while I/O pad 131 is grounded could shunt the ESD current through ESD protection device 132, along the VDD rail or bus to power clamp 116, through big SOI transistor 40 (FIG. 5) in power clamp 116 to VSS, along the VSS bus to ESD protection device 138, and then through ESD protection device 138 to I/O pad 131.

An ESD pulse applied to VSS with VDD grounded would go through big SOI transistor 40 in power clamp 116.

Figure 14:
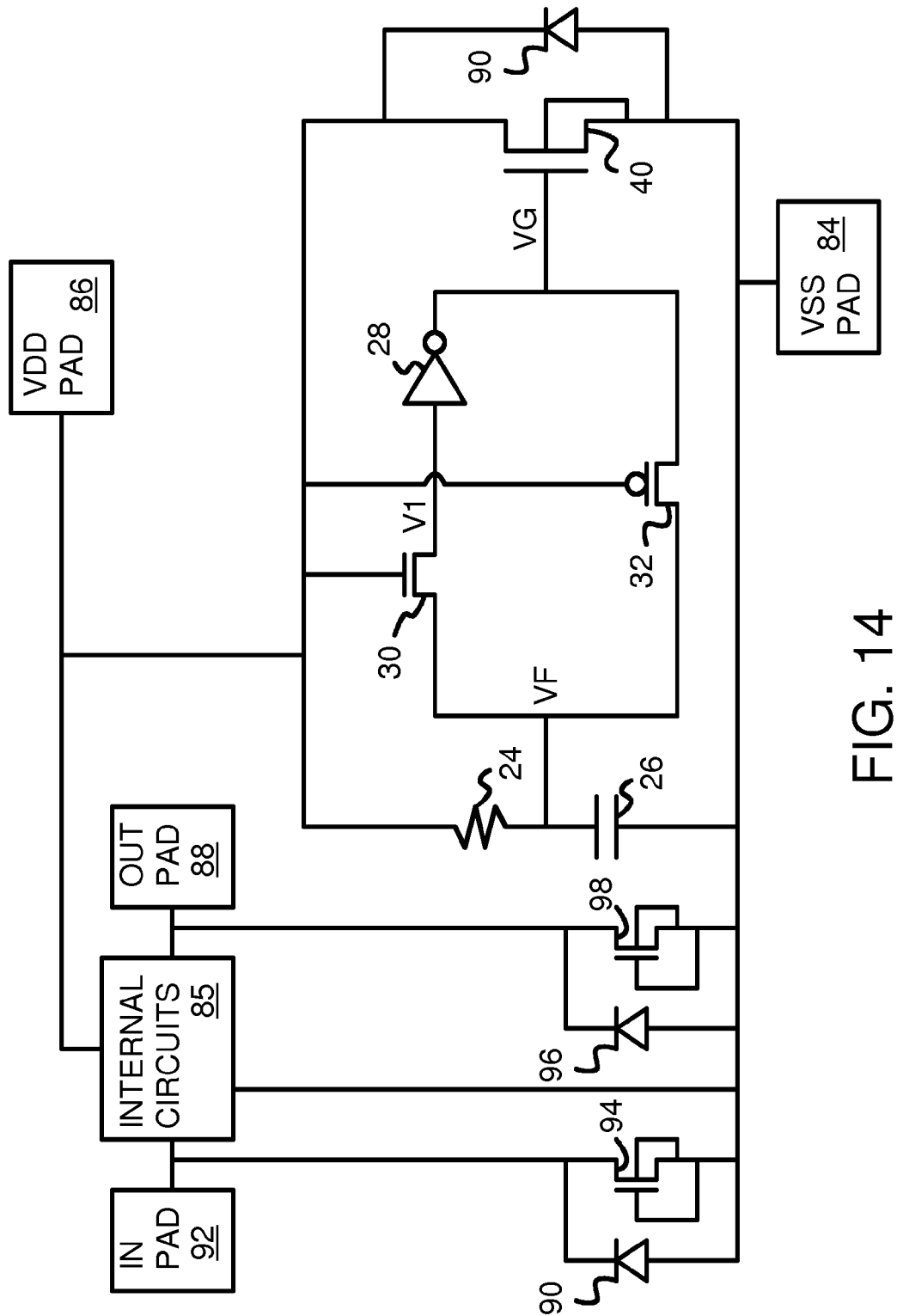
FIG. 14 shows full-chip pad-based ESD protection using SOI devices with a triggering current.

FIG. 14 shows full-chip pad-based ESD protection using SOI devices with a small diode for generating a triggering current. Rather than have four ESD protection devices 132, 134, 136, 138 for each I/O pad, die area used may be reduced by providing only one ESD-protection device per I/O pad.

A power clamp as described in FIG. 5 between VDD and VSS is triggered by resistor 24 and capacitor 26 through the two paths through n-channel pass transistor 30 and p-channel pass transistor 32 to drive gate VG of big SOI transistor 40.

Each pad 92, 88 is locally protected by grounded-gate n-channel transistors 94, 98 and diodes 90, 96, which may be a big SOI diode. However, no local protection to VDD is provided at the pads.

Grounded-gate n-channel transistors 94, 98 turn on when pads 92, 88 have a higher voltage than VSS pad 84, such as for an ESD pulse applied to pad 92 when VSS pad 84 is grounded. Likewise, diodes 90, 96 are forward biased and turn on when pads 92, 88 have a lower voltage than VSS pad 84, such as for a positive ESD pulse applied to VSS pad 84 when pad 92 is grounded. When a positive ESD pulse is applied from VDD pad 86 to one of pads 92, 88, the power clamp (BigFET 40) and diode 90 (or 96) are turned on to shunt ESD current.

However, when a positive ESD pulse is applied from one of pads 92, 88 to VDD pad 86, grounded-gate n-channel transistors 94, 98 do not turn on since their gates, connected to VSS pad 84, are floating.

Grounded-gate n-channel transistors 94, 98 are able to turn on once a triggering current passes through them. Before the triggering current, grounded-gate n-channel transistors 94, 98 remain off, potentially allowing an ESD pulse applied to one of pads 92, 88 to harm internal circuits 85.

Figure 1:
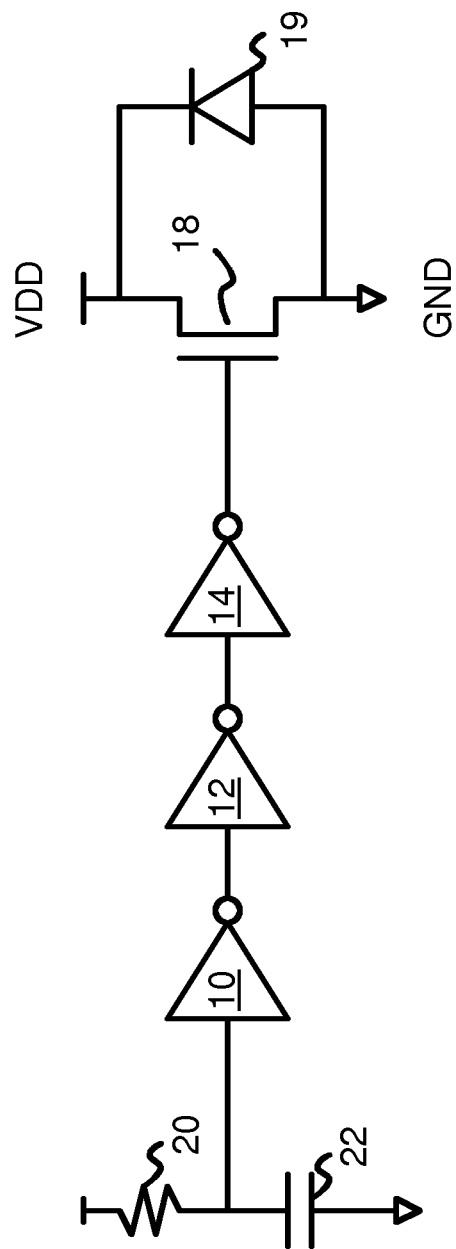
FIG. 1 shows a prior art power-to-ground ESD protection circuit with an active R-C triggered BigFET power clamp.
Figure 2:
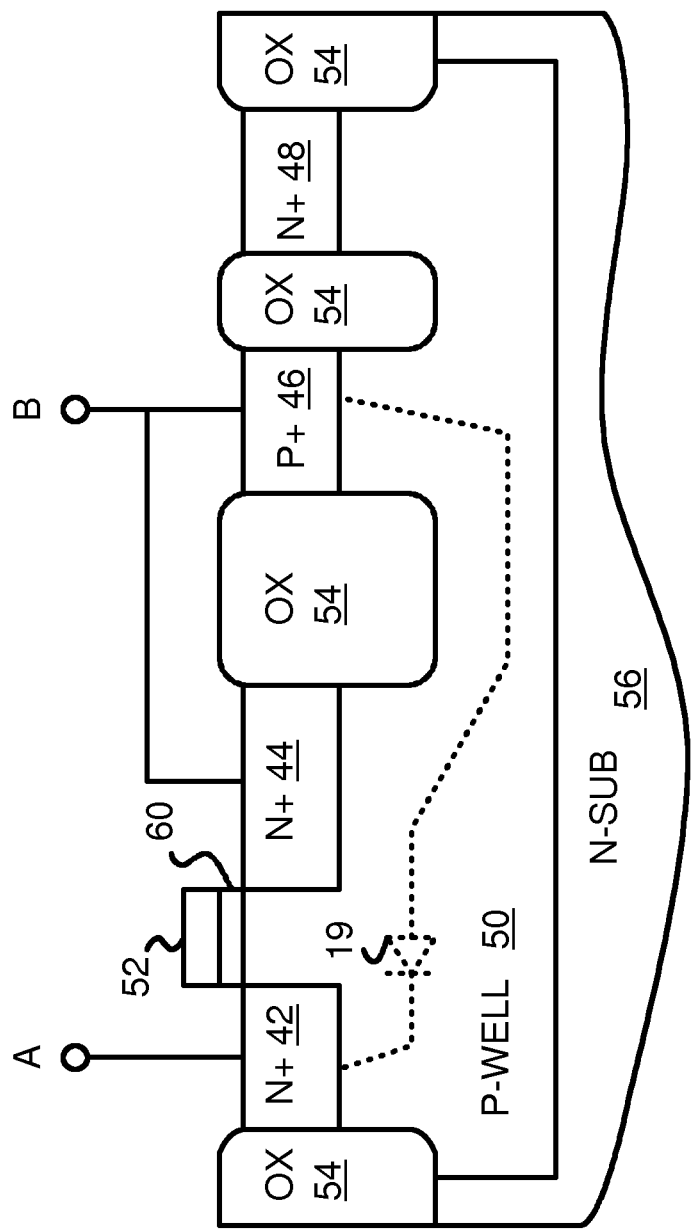
FIG. 2 is a cross-section of a BigFET ESD protection device using a typical silicon process.
Figure 3:
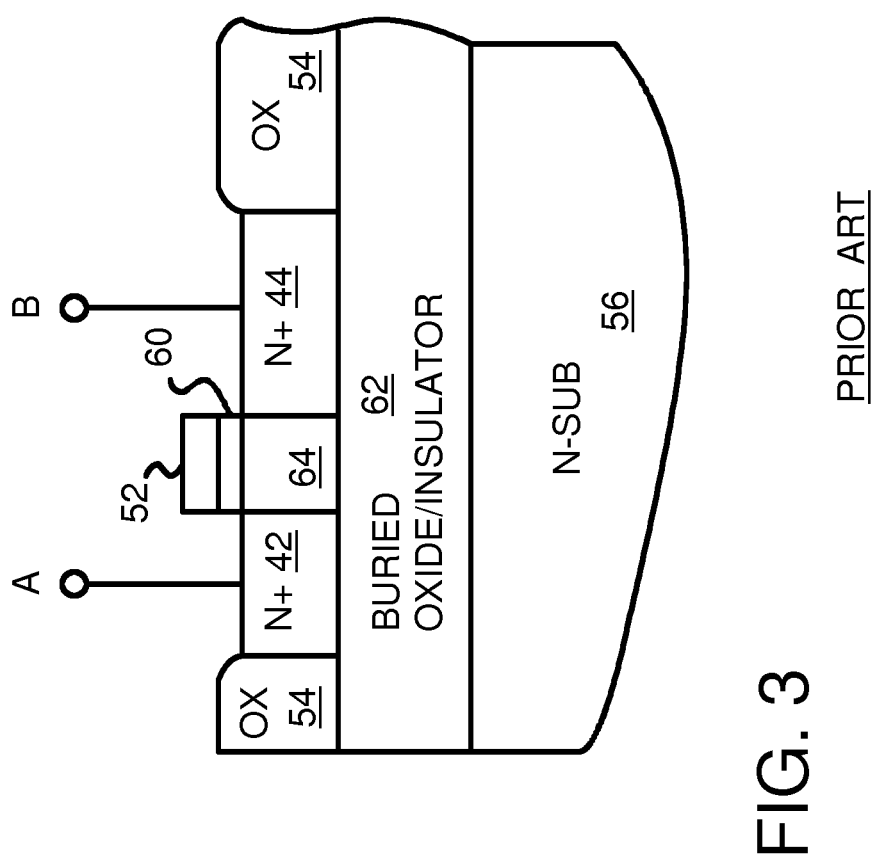
FIG. 3 is a cross-section of a BigFET ESD protection device on a SOI process.
Figure 4:
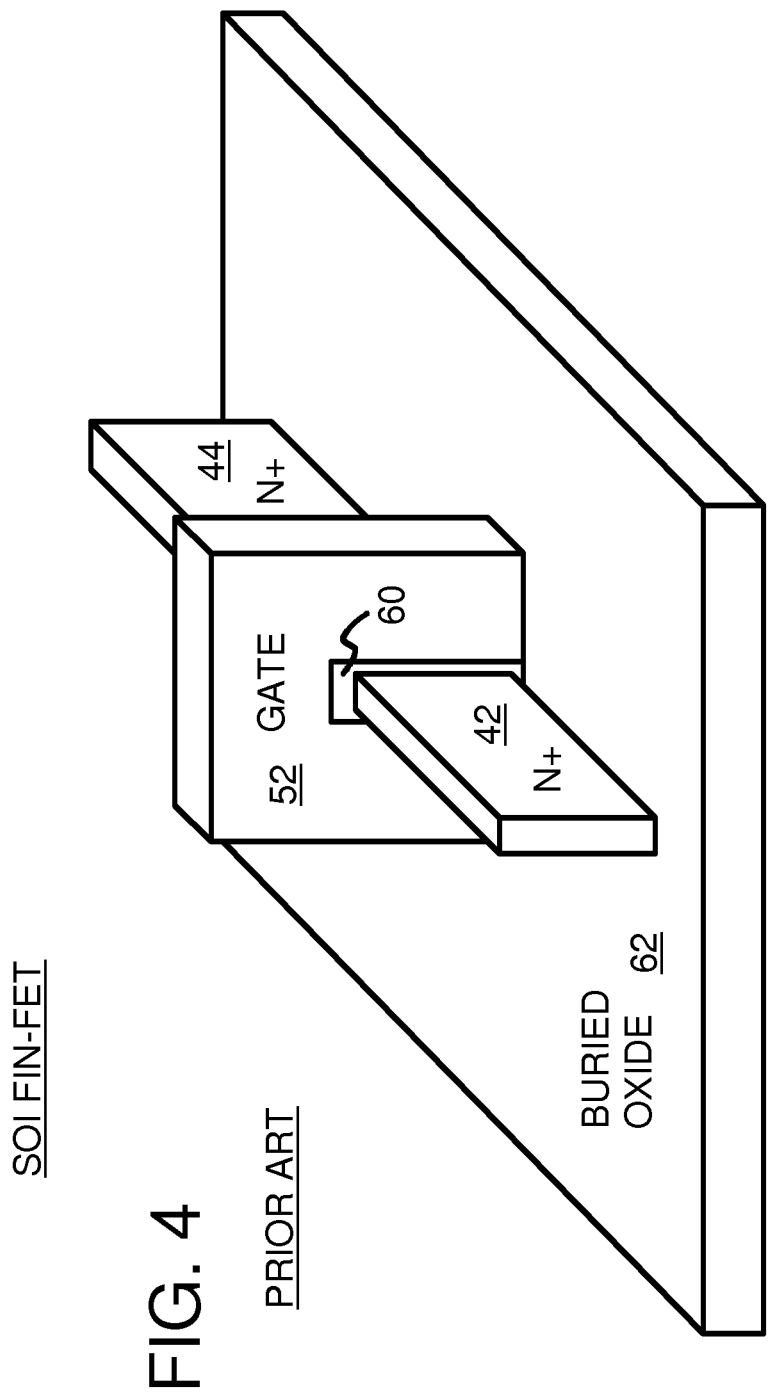
FIG. 4 shows a SOI FIN-FET device.

SOI diode 90 provides a small triggering current. SOI diode 90 is small and may be 1/20 the size of parasitic substrate diode 19 (FIG. 1) and shunt only 100 mA of current. When a positive ESD pulse is applied to output pad 88, and VDD pad 86 is grounded, leakage and substrate current couples through grounded-gate n-channel transistor 98 to cause the VSS bus to rise in voltage. Once this rise in VSS voltage reaches the pn junction threshold voltage of about 0.5 volt, SOI diode 90 becomes forward biased and current flows through SOI diode 90 from VSS to VDD. This small current causes grounded-gate n-channel transistor 98 to snap-back and turn on.

Thus protection is provided from pads 92, 88 to VDD pad 86, even though local ESD protection devices to VDD are not provided for all pads. Instead, SOI diode 90 generates a small triggering current that turns grounded-gate n-channel transistors 94, 98 on more fully, more quickly shunting the ESD pulse. All combinations of input, output, VDD, and VSS pads are protected.

Alternate Embodiments

Several other embodiments are contemplated by the inventors. For example various transistor technologies may be used rather than standard complementary metal-oxide-semiconductor (CMOS) or SOI. Many variations of SOI technology are possible, such as fully depleted and 3-D SOI such as FIN-FET.

A BigFET may be an n-channel SOI transistor or may be a p-channel SOI transistor in some process technologies. A BigFET may be a metal-oxide-semiconductor field-effect transistor (MOSFET), however the gate may not be a true metal but may be other metal-like materials such as a silicide layer, polysilicon layer, etc. A BigFET has a gate width of 1,000 to 5,000 μm for silicon substrates, but substrates with faster mobilities such as GaAs may have a BigFET with a gate width of less than 1000 μm. SOI devices may have a gate width of 1,000 to 5,000 μm. Big SOI transistor 40 may be sized to conduct a large current without damage, such as 100 mA, 1 A, or more over a short time such as 10 ns.

Additional process steps such as implants may be used to adjust properties of the transistors, capacitors, or other components. Guard rings or larger device sizes may also be used to strengthen the devices against high voltages. Rather than use a minimum gate length, a larger gate length may be used.

The gates of n-channel pass transistor 30 and p-channel pass transistor 32 could be generated by an additional string of inverters rather than directly from node VDD. Additional inverters or delays could be added in the dual paths to gate VG. Leaker resistors or transistors could be added to other nodes, such as a leaker to power from node V1, or a leaker resistor to ground from node VG.

The resistor and capacitor could be swapped so that the capacitor is connected between VF and VDD, while the resistor is connected between VF and VSS. Then the filter voltage would be inverted, and the inverter could be placed between p-channel pass transistor 32 and VG. Alternately, the gates of n-channel pass transistor 30 and 32 could be connected to VSS rather than VDD. VSS or VDD could be replaced with an I/O pad for a local ESD device.

Other implementations of the capacitors and resistors are possible in different process technologies. Longer strings of inverters can be substituted, or more complex gates other than inverters can be used. R-C elements can be added to various nodes, such as nodes within the dual paths. Parasitic resistances and capacitance may also be present. Additional filtering or more complex filters may be used. Resistors and capacitors can be implemented in a variety of ways, and might be located under the bonding-pad metal to minimize area. The resistance and capacitance values described herein are examples only and may be varied. Transistor sizes may also vary and inverter stages can be scaled up in size when big SOI transistor 40 is large.

Each inverter could be replaced with three inverters, or some other odd number of inverters. Delay lines and buffers could also be added. The terms source and drain are interchangeable, and current be considered to be positive or negative, depending on flow directions and charge. Diodes may be implemented as n-channel, p-channel, or bipolar transistors, or junctions within these transistors, and may be formed over buried oxide 62 as an SOI diode or over a silicon substrate as a standard diode. The power node could be a common-discharge line (CDL) that normally floats rather than a power line. There may be several internal nodes that connect to different input or output pads. The input/output pads may be connected to an input buffer, test-scan logic, and other circuits. More than one power supply may be used.

Alternately, several power clamps with different combinations of transistors and power-supply voltages may be used. Each pad may have only one ESD protection device, only two ESD protection devices, or four ESD protection devices per pad as shown in FIG. 13. The anode and cathode (A and K) nodes may be reversed to swap the direction of protection.

VDD and other voltage values may vary somewhat due to process, temperature, and design variances. For example, the forward bias voltage may be 0.5 volt, +/−0.1 volt, the trigger voltage may be 4 volts, +/−0.5 volts, and the holding voltage may be 2 volts +/−0.5 volts. Other values are possible. The snap-back breakdown voltage of big SOI transistor 40 may be adjusted. Snap-back voltages may vary with process, temperature, and exact geometries of the transistors. While descriptions of operation have been given based on a theoretical understanding of the physical processes, these theoretical descriptions may be incorrect. Second and third order effects may also be present. Various mechanisms may be responsible for breakdown and conduction under various conditions.

While output pads have been described, other connection technologies may be substituted, such as ball-grid-array (BGA), flip-chip, pins, etc., and the term pads is considered to apply to all such balls, pads, landings, etc. that are for external connection.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A Silicon-On-Insulator (SOI) Electro-Static-Discharge (ESD) protection structure comprising:
    a shunting SOI transistor having a first source/drain connected to a first terminal, a second source/train connected to a second terminal, and a gate connected to a gate node, the gate controlling a channel in a channel region between the first and second source/drains;
    a buried oxide under the first and second source/drains and the channel region, the buried oxide preventing current flow from the first and second source/drains and the channel region to a substrate, wherein a parasitic substrate diode is not available for ESD protection under the shunting SOI transistor;
    a resistor connected between the first terminal and a filter node;
    a capacitor connected between the second terminal and the filter node;
    a n-channel pass transistor having a gate connected to the first terminal, a drain connected to the filter node, and a source connected to an inverting node;
    an inverter that inverts the inverting node to drive the gate node of the shunting SOI transistor; and
    a p-channel pass transistor having a gate connected to the first terminal, a source connected to the filter node, and a drain connected to the gate node of the shunting SOI transistor;
    whereby the shunting SOI transistor shunts ESD pulses without assistance from a parasitic substrate diode.

2. The SOI ESD protection structure of claim 1 wherein a positive ESD pulse applied to the first terminal when the second terminal is grounded activates the n-channel pass transistor to conduct from the filter node to the inverting node to cause the inverter to drive the gate node high to turn on the shunting SOI transistor to shunt the positive ESD pulse;
    wherein a negative ESD pulse applied to the first terminal when the second terminal is grounded activates the p-channel pass transistor to conduct from the filter node to drive the gate node high to turn on the shunting SOI transistor to shunt the negative ESD pulse.

3. The SOI ESD protection structure of claim 2 wherein a positive ESD pulse applied to the second terminal when the first terminal is grounded activates the p-channel pass transistor to conduct from the filter node to drive the gate node high to turn on the shunting SOI transistor to shunt the positive ESD pulse from the second terminal to the first terminal.

4. The SOI ESD protection structure of claim 1 wherein the n-channel pass transistor and the p-channel pass transistor are SOI transistors formed over the buried oxide and having no silicon substrate that can conduct current from the SOI transistor.

5. The SOI ESD protection structure of claim 1 wherein the first terminal is a VDD supply node;
    wherein the second terminal is a VSS node;
    wherein the SOI ESD protection structure is a power clamp between the VDD supply node and the VSS node.

6. The SOI ESD protection structure of claim 5 further comprising:
    a small SOI diode formed over the buried oxide, the small SOI diode having a P+ region and a N+ region;
    wherein the small SOI diode is connected between the VDD supply node and the VSS node;
    wherein the small SOI diode generates a trigger current that is no more than 100 mA.

7. The SOI ESD protection structure of claim 6 wherein the trigger current activates a grounded-gate n-channel transistor to conduct ESD current from an I/O pad to the VSS node when an ESD pulse is applied between the I/O pad and the VDD supply node.

8. The SOI ESD protection structure of claim 1 wherein the shunting SOI transistor is a FIN-FET transistor having a non-planar gate.

9. The SOI ESD protection structure of claim 8 wherein the first source/drain, the channel region, and the second source/drain are formed together on a fin of semiconductor material, the fin having a minimum dimension that is a horizontal thickness that is smaller than a vertical height of the fin;
    wherein a gate surrounds the channel region of the fin, the gate having an inverted U-shape;
    a gate oxide formed between the channel region and the gate, wherein the gate oxide is formed on three interior sides of the inverted U-shape of the gate, wherein a voltage applied to the gate couples through the gate oxide on the three interior sides to create a field-effect channel within the channel region,
    whereby a field-effect channel is formed across the gate oxide from the three interior sides of the inverted U-shaped gate.

10. An Electro-Static-Discharge (ESD) protection circuit comprising:
- a first bus for carrying a power or a ground voltage;
- a second bus for carrying a power or a ground voltage;
- a filter connected between the first bus and the second bus, the filter having a resistor and a capacitor in series with an intermediate node between the resistor and the capacitor;
- a clamp transistor having a channel connected between the first bus and the second bus, the channel being formed over an insulator wherein the channel is electrically isolated from a substrate, the channel not having any parasitic diodes to the substrate capable of conducting current;
- a clamp gate of the clamp transistor, the clamp gate formed over the channel to exert an electric field into the channel, the electric field controlling formation of a conducting region in the channel to allow current to be conducted between the first bus and the second bus when an activation voltage is applied to the clamp gate;
- a first pass transistor having a channel with a conducting region of a first polarity type and a gate connected to the first bus, the first pass transistor for connecting the intermediate node to an inverting node;
- an inverter for inverting the inverting node to drive the clamp gate; and
- a second pass transistor having a channel with a conducting region of a second polarity type that is a complement to the first polarity type, having a gate connected to the first bus, the second pass transistor for connecting the intermediate node to the clamp gate.

11. The ESD protection circuit of claim 10 wherein the first pass transistor, the second pass transistor, and the clamp transistor are Silicon-On-Insulator (SOI) transistors that are formed over an insulator layer without an underlying substrate that electrically connects to channels or forms parasitic diodes to sources or drains of the first pass transistor, the second pass transistor, or the clamp transistor.

12. The ESD protection circuit of claim 11 wherein the clamp transistor has a channel with a conducting region of the first polarity type;
- wherein the clamp transistor is sized to carry a current of one amp for at least 10 nanoseconds without being damaged.

13. The ESD protection circuit of claim 11 wherein the first polarity type is a negative type, wherein the first pass transistor conducts when its gate is connected to a high voltage and isolates when connected to a low voltage, the high voltage being at least a transistor threshold voltage above the low voltage;
- wherein the second polarity type is a positive type, wherein the second pass transistor conducts when its gate is connected to a low voltage and isolates when connected to a high voltage, the high voltage being at least a transistor threshold voltage above the low voltage.

14. The ESD protection circuit of claim 13 wherein the resistor is connected between the first bus and the intermediate node;
- wherein the capacitor is connected between the intermediate node and the second bus.

15. The ESD protection circuit of claim 14 wherein the first bus carries a VDD power voltage and the second bus carriers a VSS ground voltage during normal operation;
- wherein the ESD protection circuit is a power clamp for shunting ESD pulses between VDD and VSS, and for shunting ESD pulses that are shunted to VDD or VSS by local ESD protection structures located near I/O pads on a SOI chip.

16. The ESD protection circuit of claim 10 further comprising:
- local ESD protection structures that connect to the second bus and do not connect to the first bus;
- a small SOI diode formed over an insulator, connected between the first bus and the second bus, the SOI diode becoming forward biased when a local ESD protection structure receives an ESD pulse and the first bus is grounded;
- wherein the small SOI diode conducts a trigger current to the local ESD protection structure to trigger the local ESD protection structure to conduct a high current, the high current being at least 10 times the trigger current.

17. The ESD protection circuit of claim 16 wherein the clamp transistor conducts at least ten times the trigger current;
- wherein the SOI diode conducts a smaller current than the clamp transistor.

18. A Silicon-On-Insulator (SOI) Electro-Static-Discharge (ESD) power clamp comprising:
- a power-supply bus;
- a ground bus;
- a filter resistor connected between the power-supply bus and a filter node;
- a filter capacitor connected between the ground bus and the filter node;
- an n-channel transistor having a gate connected to the power-supply bus to control a conducting channel for conducting current between the filter node and an inverting node;
- an inverter that inverts the inverting node to drive a big gate node;
- a p-channel transistor having a gate connected to the power-supply bus to control a conducting channel for conducting current between the filter node and the big gate node;
- a big transistor, sized to conduct a current of at least 100 mA between the power-supply bus and the ground bus, the big transistor being an SOI Field-Effect Transistor (FET) with a gate connected to the big gate node;
- wherein the big transistor is formed on an insulator rather than a semiconducting substrate, and the big transistor has no parasitic substrate diode;
- wherein the big transistor conducts bi-directionally, wherein an ESD pulse applied to the power-supply bus is conducted to the ground bus, and wherein an ESD pulse applied to the ground bus is conducted to the power-supply bus without using a parasitic substrate diode.

19. The SOI ESD power clamp of claim 18 wherein the n-channel transistor and the p-channel transistor are SOI transistors.

20. The SOI ESD power clamp of claim 19 wherein the big transistor, the n-channel transistor, and the p-channel transistor are each a FIN-FET transistor having a non-planar gate that surrounds a channel region of a fin-shaped semiconductor material that includes a source, a drain, and the channel region.

* * * * *